United States Patent
Zhang et al.

(10) Patent No.: US 9,966,975 B2
(45) Date of Patent: May 8, 2018

(54) ITERATIVE DECODING SCHEME OF CONCATENATED LDPC AND BCH CODES FOR OPTICAL TRANSPORT NETWORK

(71) Applicant: NEC Laboratories America, Inc., Princeton, NJ (US)

(72) Inventors: Shaoliang Zhang, Princeton, NJ (US); Fatih Yaman, Monmouth Junction, NJ (US); Wei Zhou, Princeton, NJ (US)

(73) Assignee: NEC Corporation (JP)

(*) Notice: Subject to any disclaimer, the term of this patent is extended or adjusted under 35 U.S.C. 154(b) by 0 days. days.

(21) Appl. No.: 15/287,658

(22) Filed: Oct. 6, 2016

(65) Prior Publication Data
US 2017/0104496 A1  Apr. 13, 2017

Related U.S. Application Data

(60) Provisional application No. 62/240,047, filed on Oct. 12, 2015.

(51) Int. Cl.
| | |
|---|---|
| H03M 13/27 | (2006.01) |
| H04B 10/58 | (2013.01) |
| H04B 10/60 | (2013.01) |
| H04L 1/00 | (2006.01) |
| H03M 13/29 | (2006.01) |
| H03M 13/37 | (2006.01) |
| H03M 13/15 | (2006.01) |
| H03M 13/11 | (2006.01) |

(52) U.S. Cl.
CPC ... *H03M 13/2792* (2013.01); *H03M 13/2906* (2013.01); *H03M 13/3746* (2013.01); *H04B 10/58* (2013.01); *H04B 10/60* (2013.01); *H04L 1/0041* (2013.01); *H04L 1/0045* (2013.01); *H04L 1/0058* (2013.01); *H04L 1/0064* (2013.01); *H03M 13/1128* (2013.01); *H03M 13/152* (2013.01)

(58) Field of Classification Search
CPC ..................................................... H04L 1/0009
USPC ........................................ 714/774, 775, 788
See application file for complete search history.

(56) References Cited

U.S. PATENT DOCUMENTS

| | | | |
|---|---|---|---|
| 2005/0132260 A1* | 6/2005 | Kyung | H03M 13/1148 714/752 |
| 2015/0039964 A1* | 2/2015 | Fonseka | H03M 13/253 714/756 |

* cited by examiner

*Primary Examiner* — Fritz Alphonse
(74) *Attorney, Agent, or Firm* — Joseph Kolodka

(57) ABSTRACT

Systems and methods are disclosed for optically communicating data by, at a transmitter side, encoding a block of input bits by one or more outer encoders, and after interleaving the encoded bits, permuting the encoded bits according to a predetermined sequence or order, and further encoding the encoded bits by an inner encoder, and at a receiver side, decoding received bits with an inner decoder, and after the encoded bits are permuted, subsequently decoding by and outer decoder, and returning information bits at an outer decoder as an output. The soft-decision and hard-decision outputs from the outer BCH code help the inner LDPC decoder to have better estimation of the received bits and gain performance. The performance in higher-order modulation formats could be as large as 0.5 dB in one embodiment.

16 Claims, 5 Drawing Sheets

ITERATIVE DECODING SCHEME OF CONCATENATED LDPC AND BCH CODES FOR OPTICAL TRANSPORT NETWORK

This application claims priority to Ser. 62/240,047 filed Oct. 12, 2015, the content of which is incorporated by reference.

BACKGROUND

The present invention relates to optical communications. Low-density parity check (LDPC) codes are becoming standard codes in many applications due to their outstanding performance in the waterfall region. However, the error floor phenomenon prevents the usage of LDPC in optical transmission systems, because the required bit error rate for the optical transmission system is typically as low as $10^{-15}$. As a result, a concatenated BCH and LDPC coding system has been proposed to eliminate the error floor. However, the performance of concatenated LDPC and BCH codes in the waterfall region becomes degraded compared to that of LDPC due to a phenomenon called rate loss.

SUMMARY

In one aspect, systems and methods are disclosed for optically communicating data by, at a transmitter side, encoding a block of input bits by one or more outer encoders, and after interleaving the encoded bits, permuting the encoded bits according to a predetermined sequence or order, and further encoding the encoded bits by an inner encoder, and at a receiver side, decoding received bits with an inner decoder, and after the encoded bits are permuted, subsequently decoding by an outer decoder, and returning information bits at an outer decoder as an output.

In another aspect, iterative decoding of LDPC and BCH codes are used, in which both hard-in and soft-in BCH decoders can be readily adapted into the architecture. In order to obtain high coding gain, a two-dimension encoding and decoding scheme is used, where the number of BCH codes (or LDPC codes) in the interleaver can be configured. With more number of BCH codes in the interleaver, more information is propagated back and forth in the decoding iteration process. The size of the interleaver improves the coding gain for the concatenated codes.

Advantages of the preferred embodiment may include one or more of the following. The iterative decoding scheme between BCH and LDPC decoder enhances the performance of the concatenated codes while keeping the similar decoding complexity soft-decision and hard-decision outputs from the outer BCH code, which eventually helps the inner LDPC decoder to have better estimation of the received bits and gain performance. The performance in higher-order modulation formats could be as large as 0.5 dB. In one embodiment, a coding gain improvement of 0.8 dB is achieved at a bit error rate (BER) $1 \times 10^{-6}$ compared to conventional concatenation coding scheme. Simulation shows that BER curve converges very fast at only a few outer iterations, which makes the decoding scheme very suitable for low latency transmission system, such as optical transport network. The iterative decoding scheme works even better if it is coupled with higher modulation scheme such as quadrature phase-shifted-keying (QPSK), 8-qaudrature amplitude modulation (QAM) and 16-QAM in optical transmission systems.

DESCRIPTION

Figure 1:
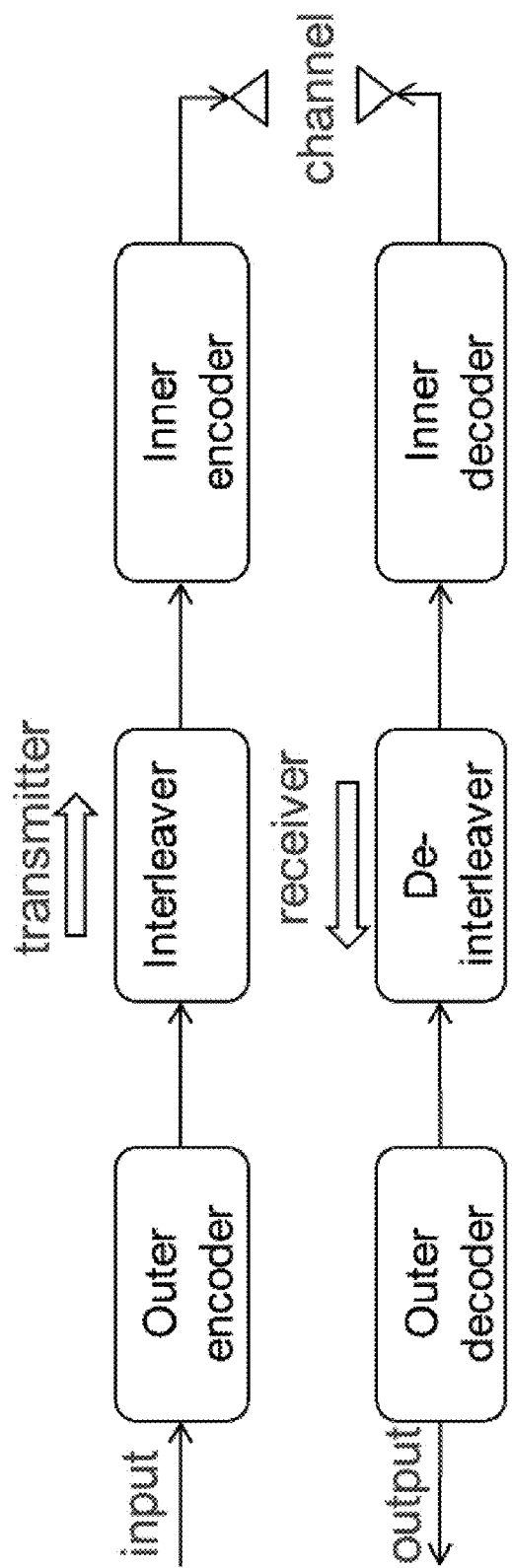
FIG. 1 shows an exemplary block diagram of encoding and decoding of concatenated codes.

FIG. 1 depicts the functional blocks of the concatenated codes. At the transmitter side, a block of information bits (input) is first encoded by outer encoders. After the interleaving, the sequence of coded bits is permuted according to some order. Then the coded bits are further encoded by the inner encoder (zero-bits are padded if the number of coded bits of outer code is less than that of information bits of inner code). At the receiver side, the received bits are first decoded by inner decoder. After the coded bits are permuted back, then they are decoded by the outer decoder, information bits are returned at the output of outer decoder as the output.

Next, concatenated LDPC and BCH(HD) iterative decoding details are discussed. The iterative decoding system improves the coding gain in the waterfall region. The iterative coding scheme is typically for soft-in-soft-out decoders for both inner and outer code. Both hard-in-hard-out and soft-in-hard-out BCH decoders can be used; the output of BCH decoder is also converted to soft bits for the input of LDPC decoder. For simplicity, the hard-in-hard-out BCH decoder is referred to as a hard-decision (HD) decoder, and soft-in-hard-out BCH decoder as the soft-decision (SD) decoder. In addition, the iteration between the LDPC and BCH code is referred to as the outer iteration, as opposed to the inner iteration which is performed within the LDPC codes.

Figure 2:
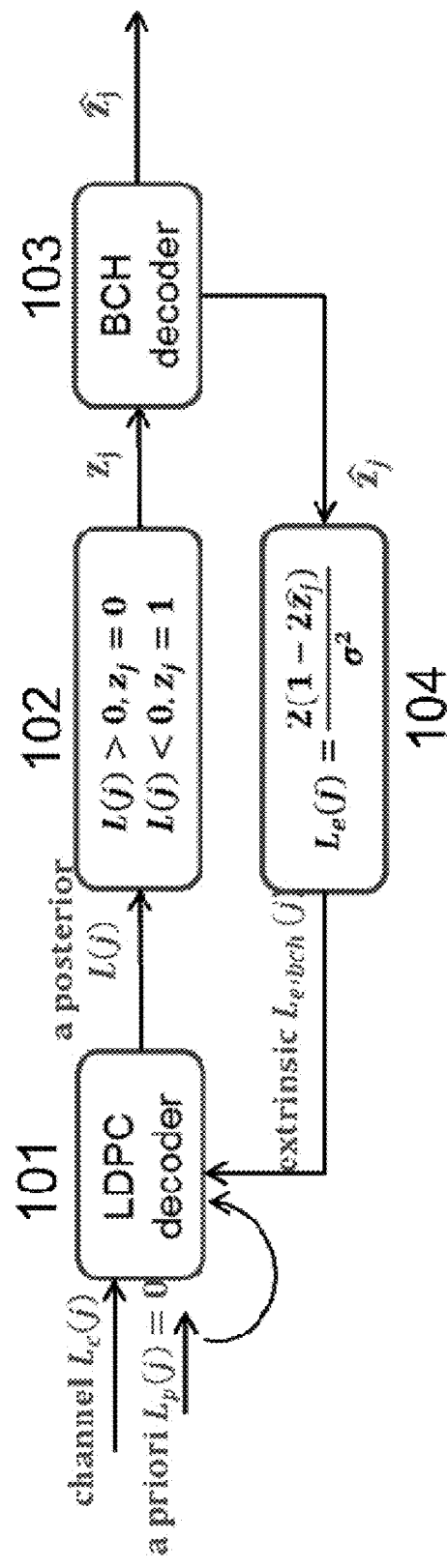
FIG. 2 shows an exemplary diagram of concatenated LDPC and BCH hard-decision (HD) iterative decoding.

FIG. 2 depicts the block diagram of one embodiment of the concatenated LDPC and BCH iterative decoding scheme. The received codeword is first decoded by LDPC (inner code) decoder. At the first iteration, the decoder is fed with channel log-likelihood-ratio (LLR) only. A priori LLR is zero because the system assumes equally transmitted zeros and ones. A posterior LLR, L(j) at the output of LDPC decoder (101) is sum of channel LLR $L_c(j)$ and extrinsic LLR $L_{e,ldpc}$ (j). Hard-decision bits z are obtained for the BCH decoder input according to the sign of L(j), as is shown upper middle block (102). If a SD BCH decoder (with Chase-2 algorithm) is used, then τ least bits among L(j) are found, and all combinations of zeros and ones are added to z, in the positions corresponding to those least unreliable bits. At the BCH decoder output (103), only hard-decision output $\hat{z}_j$ is available. In order to feedback extrinsic information to the LDPC decoder, the hard output bit $\hat{z}_j$ is converted to the soft information $$L_e(j) \text{ by } L_e(j) = \frac{2(1 - 2\hat{z}_j)}{\sigma^2},$$

which is also shown in the bottom block (104), where $\sigma^2$ is variance of noise. A priori information for LDPC decoder in the second iteration and beyond are updated as follows (not exactly shown in FIG. 2): those of the coded bits corresponding to the information bits of BCH codes are sum of $L_{e,ldpc}(j)+L_e(j)$, and those of rest bits (i.e., the redundant bits of LDPC code and BCH code) are just $L_{e,ldpc}(j)$. The iteration between LDPC and BCH decoder is repeated until all β legitimate BCH codewords are found or the maximum number of outer iterations is reached.

Figure 3:
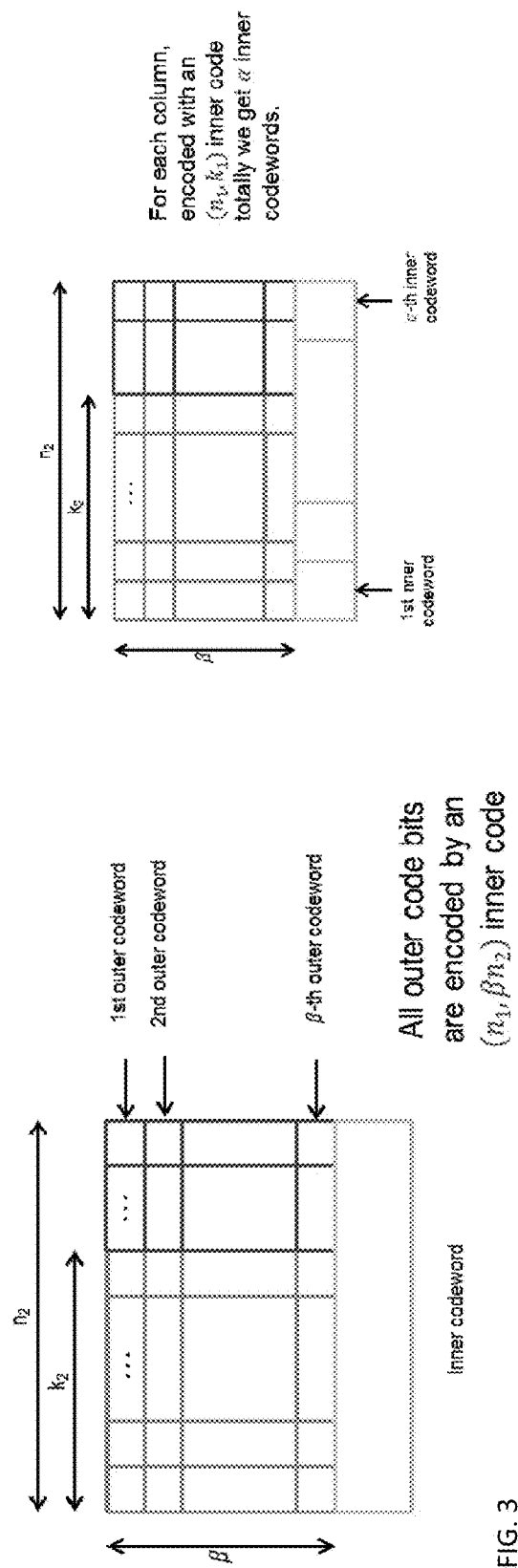
FIG. 3 shows an exemplary one dimensional encoding vs. two dimensional encoding.

FIG. 3 shows exemplary one dimensional encoding vs. two dimensional encoding comparison.

In one dimensional encoding, the system starts with $\beta \times k_2$ information bits to be encoded as shown in green block in FIG. 3. Each row of information bits are encoded by an $(n_2, k_2)$ codeword as shown in blue block, totally there are β outer codeword. All these coded bits then are encoded by a single $(n_1, k_1)$ inner code as shown in yellow block, (zeros are padded if the number of coded bits is less than the information bits of $k_1$, i.e., $\beta n_2 < k_1$). In one dimensional encoding scheme, there is a single inner code.

In two-dimensional encoding, the system also starts with $\beta \times k_2$ information bits, where β is a factor of $k_1$. Each row of information bits are encoded by an $(n_2, k_2)$ codeword, which is the same as that in one dimensional encoding. Then each sub-block of $\beta \times k_1/\beta$ of coded bits are encoded by an $(n_1, k_1)$ inner code(columns of zero information bits are appended if $n_2$ is not divisible by $k_1/\beta$), so totally there are $$\left\lceil \beta \times \frac{n_2}{k_1} \right\rceil$$

inner codes in the two dimensional encoding scheme, as opposed to one inner code in one dimensional coding scheme.

In one test, a column weight 3 (5200, 4683) LDPC code is constructed to concatenate with a (255, 231) BCH code, the overall code rate is 0.810, which is a good candidate code for optical transmission system. The codeword is assumed to be transmitted through a AWGN channel. Without otherwise stated in the plot, β=223, that is, there are 223 BCH codes (or equivalently, 13 LDPC codes) transmitted together. The number of inner LDPC iterations is set to 10, and number of outer iterations between LDPC and BCH decoder is set to 2, 3 or 5. The maximum number of iterations of LDPC codes is set to 50 for the non-iterative decoding scheme, which is equal to that of iterative decoding with κ maximum outer iterations. As can be seen from FIG. 3a, the iterative decoding scheme with HD BCH decoder outperforms the non-iterative one by around 0.2 dB at a BER=$10^{-6}$. Having taken reliability information of a posterior probability, L(j), into account, the iterative decoding scheme with SD BCH decoder provides 0.4 dB coding gain improvement. In both iterative decoding schemes, more coding gain improvement is expected at a lower BER. The decoding converges very fast; the performance with 2 outer iterations (iter=2) is already very close to that with 5 iterations for HD BCH decoder. The fast convergence of BER curve makes the decoding very suitable in the optical transmission system because of the low latency requirement. FIG. 3B shows the performance of concatenated coding system with different β. The number of outer iteration is set to 2. The coding gain with β=223 and 1561 are improved by 0.2 dB and 0.3 dB at a BER=$10^{-6}$, respectively.

Figure 4B:
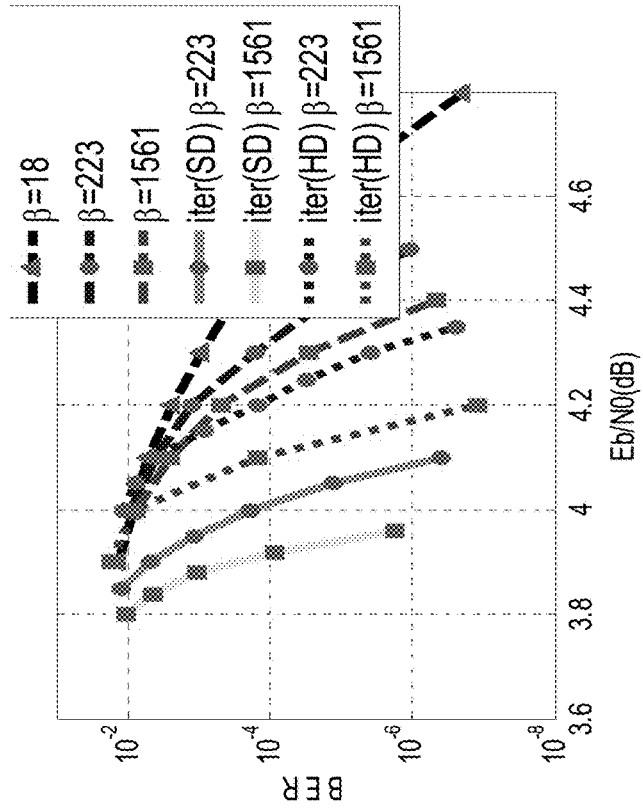
FIG. 4B shows an exemplary performance with concatenated LDPC (5200, 4683) and BCH (255, 231) with different (3 (i.e., number of BCH codes).
Figure 4A:
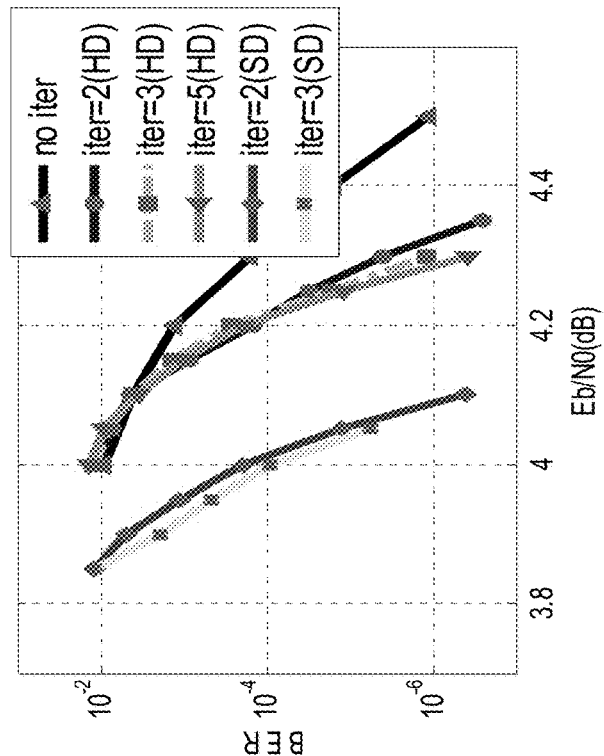
FIG. 4A shows an exemplary performance with concatenated LDPC (5200, 4683) and BCH (255, 231) under different outer iterations.
Figure 5:
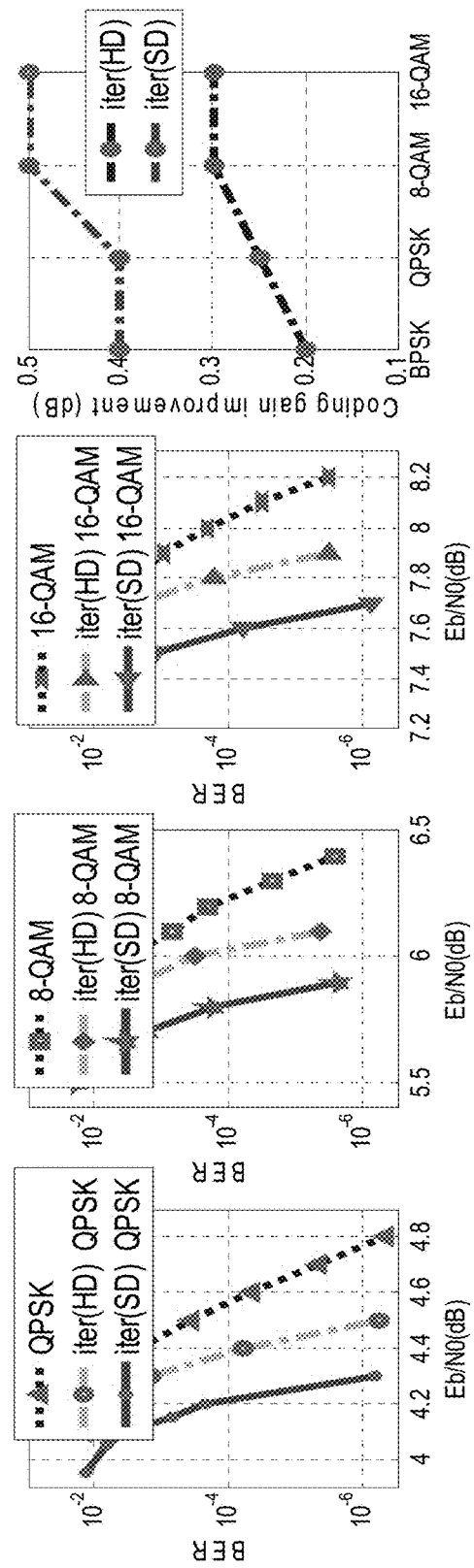
FIG. 5 shows an exemplary performance with concatenated LDPC (5200, 4683) and BCH (255, 231) in different modulation formats (QPSK/8-QAM/16-QAM).

FIG. 4A shows the performance of concatenated LDPC (5200, 4683) and BCH (255, 231) under different outer iterations, while FIG. 4B shows performance of concatenated LDPC (5200, 4683) and BCH (255, 231) with different β (i.e., number of BCH codes). There is additional 0.2 dB coding gain improvement from iterative decoding scheme with HD BCH decoder, and 0.4 dB with SD BCH decoder using Chase-2 algorithm. Overall, the iterative decoding with SD and HD BCH decoder provides 0.6 dB and 0.4 dB coding gain at a BER=$1 \times 10^{-6}$, respectively, compared to the non-iterative scheme with β3=18, i.e., the number of BCH codes used in the concatenated codes. A larger coding gain of about 0.8 dB is also shown with β=1561 in iterative decoding with SD BCH decoder at a BER=$1 \times 10^{-6}$. It should be noted that the complexity of the iterative scheme is kept low, and the coding gain improvement is at the expense of a few more BCH code decoding during each outer iteration. The decoding scheme can be readily coupled with high modulation format, as is shown in FIG. 4. Iterative decoding with SD and HD BCH decoder provides as large as 0.5 dB and 0.3 dB coding gain improvement in 16-QAM, respectively.

What is claimed is:

1. A method for optically communicating data, comprising:
   at a transmitter side, encoding a block of input bits by one or more outer encoders, and after interleaving the encoded bits, rearranging the encoded bits according to a predetermined sequence or order, and further encoding the encoded bits by an inner encoder; and
   at a receiver side, decoding received bits with an inner decoder, and after the encoded bits are permuted, subsequently decoding by and outer decoder, and returning information bits at an outer decoder as an output;
   generating soft-decision and hard-decision outputs from an outer BCH code;
   generating an estimation of received bits and gain performance with an inner low-density parity-check (LDPC) decoder wherein the receiver side decodes the received codeword by an LDPC inner code decoder and at a first iteration, the LDPC inner decoder is fed channel log-likelihood-ratio (LLR) information; and
   performing concatenated coding with inner and outer codes with iterative decoding between the inner soft-decision and outer hard-decision codes.

2. The method of claim 1, comprising iteratively decoding soft information propagated between an inner LDPC and an outer Bose-Chaudhuri-Hocquenghem (BCH) codes.

3. The method of claim 1, comprising iteratively decoding using a soft-input BCH decoder with at least 0.2 dB gain compared to a hard-input BCH decoder.

4. The method of claim 1, comprising determining a posterior LLR, L(j) at an output of LDPC decoder as a sum of channel LLR $L_c(j)$ and extrinsic LLR $L_{e,ldpc}(j)$.

5. The method of claim 4, wherein the BCH decoder comprises a Chase-2 decoder.

6. An optical communication system, comprising:
   a transmitter for encoding a block of input bits by one or more outer encoders, and after interleaving the encoded bits, permuting the encoded bits according to a predetermined sequence or order, and further encoding the encoded bits by an inner encoder; and
   a receiver for decoding received bits with an inner decoder, and after the encoded bits are permuted, subsequently decoding by and outer decoder, and returning information bits at an outer decoder as an output,
   wherein soft-decision and hard-decision outputs are generated from an outer Bose-Chaudhuri-Hocquenghem (BCH) code and an estimation of received bits and gain performance is generated with an inner low-density parity-check (LDPC) decoder; and concatenated coding is performed with inner and outer codes by iteratively decoding between the inner soft-decision and outer hard-decision codes wherein the receiver side decodes the received codeword by an LDPC inner code decoder and at a first iteration, the LDPC inner decoder is fed channel log-likelihood-ratio (LLR) information.

7. The method of claim 6, wherein the decoder comprises a BCH Chase-2 decoder, comprising determining τ least bits among L(j), and adding combinations of zeros and ones to z, in positions corresponding to least unreliable bits.

8. The method of claim 6, wherein the BCH Chase-2 decoder generates only hard-decision output $\hat{z}_j$, comprising performing feedback extrinsic information to the LDPC decoder by converting the hard output bit $\hat{z}_j$ is converted to the soft information $L_e(j)$ by $$L_e(j) = \frac{2(1 - 2\hat{z}_j)}{\sigma^2},$$

where $\sigma^2$ is a variance of noise.

9. The method of claim 6, comprising generating a priori information for the LDPC decoder in a second iteration and beyond are updated by summing coded bits corresponding to the information bits of BCH codes as $L_{e,ldpc}$ (j)+$L_e$ (j), and generating rest bits including redundant bits of LDPC code and BCH code as $L_{e,ldpc}$ (j).

10. The system of claim 6, wherein the inner encoder pads zero-bit if the number of coded bits of an outer code is less than the information bits of an inner code.

11. The system of claim 6, wherein the receiver iteratively decodes soft information propagated between an inner LDPC and an outer BCH codes.

12. The system of claim 6, comprising performing two-dimensional encoding and decoding of LDPC and BCH concatenated codes.

13. The system of claim 6, wherein the receiver comprises a soft-input BCH decoder with at least 0.2 dB gain compared to a hard-input BCH decoder.

14. The system of claim 13, wherein the BCH decoder comprises a Chase-2 decoder.

15. The system of claim 6, wherein the BCH Chase-2 decoder generates only hard-decision output $\hat{z}_j$, comprising performing feedback extrinsic information to the LDPC decoder by converting the hard output bit $\hat{z}_j$ is converted to the soft information $L_e(j)$ by $$L_e(j) = \frac{2(1 - 2\hat{z}_j)}{\sigma^2},$$

where $\sigma^2$ is a variance of noise.

16. The system of claim 6, wherein a priori information is generated for the LDPC decoder in a second iteration and beyond are updated by summing coded bits corresponding to the information bits of BCH codes as $L_{e,ldpc}$ (j)+$L_e$ (j), and generating rest bits including redundant bits of LDPC code and BCH code as $L_{e,ldpc}$ (j).

\* \* \* \* \*